(12) United States Patent
Shao et al.

(10) Patent No.: US 11,336,277 B2
(45) Date of Patent: May 17, 2022

(54) POWER MOSFET ACTIVE GATE DRIVE BASED ON NEGATIVE FEEDBACK MECHANISM

(71) Applicants: Beijing Jiaotong University, Beijing (CN); Global Power Technology Co., Ltd., Beijing (CN)

(72) Inventors: Tiancong Shao, Beijing (CN); Zhijun Li, Beijing (CN); Trillion Q. Zheng, Beijing (CN); Bo Huang, Beijing (CN); Junxing Wang, Beijing (CN)

(73) Assignees: BEIJING JIAOTONG UNIVERSITY, Beijing (CN); GLOBAL POWER TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/243,590

(22) Filed: Apr. 29, 2021

(65) Prior Publication Data
US 2022/0123741 A1    Apr. 21, 2022

(30) Foreign Application Priority Data
Oct. 15, 2020  (CN) .......................... 202011102468.3

(51) Int. Cl.
| H03K 3/00 | (2006.01) |
| H03K 5/00 | (2006.01) |
| H03K 17/687 | (2006.01) |
| H03K 17/10 | (2006.01) |
| H01L 29/20 | (2006.01) |
| H01L 29/16 | (2006.01) |

(52) U.S. Cl.
CPC ....... *H03K 17/102* (2013.01); *H01L 29/1608* (2013.01); *H01L 29/2003* (2013.01); *H03K 17/687* (2013.01)

(58) Field of Classification Search
None
See application file for complete search history.

(56) References Cited

U.S. PATENT DOCUMENTS 7,924,066 B2 *  4/2011  Gagne ................ H03K 19/0008
                                              327/108

* cited by examiner

*Primary Examiner* — Kenneth B Wells
(74) *Attorney, Agent, or Firm* — Leong C. Lei

(57) ABSTRACT

This invention introduces the negative feedback into the gate drive. It proposes a negative feedback active gate drive (NFAGD) for silicon carbide (SiC) and gallium nitride (GaN) semiconductor devices to fully utilize their potential of high switching-speed capability in a phase-leg configuration. An auxiliary P-channel MOSFET is introduced to construct a negative feedback control mechanism. Due to the negative feedback mechanism, the proposed drive can automatically attenuate the disturbance from the complementary device of the phase-leg. The negative feedback active gate drive (NFAGD) has a simple structure and easy to be realized using a push-pull drive circuit, a drive resistor, an auxiliary MOSFET and an auxiliary capacitor, without involving any additional logical circuits. Functionally, the negative feedback active gate drive (NFAGD) can automatically suppress the induced gate-source voltage and make the gate voltage of the MOSFET stable even during high-speed switching operation without sacrificing the switching speed of the MOSFET.

3 Claims, 11 Drawing Sheets

POWER MOSFET ACTIVE GATE DRIVE BASED ON NEGATIVE FEEDBACK MECHANISM

BACKGROUND OF THE INVENTION

1. Technical Field

The present invention relates to an active gate drive circuit for a power MOSFET based on negative feedback mechanism.

2. Description of Related Art

The emergence of silicon carbide (SiC) and gallium nitride (GaN) semiconductor devices promises to revolutionize next-generation power electronics converters [1-4]. Compared with Si devices, SiC and GaN devices featured with high breakdown electric field, low on-state resistance, fast switching speed, and high junction temperature capability [5, 6]. These characteristics are beneficial for the efficiency, power density, and reliability of power electronics converters [7-9]. However, in a practical converter with phase-leg configuration, the switching transient of one device will impact its complementary device, generating the crosstalk phenomenon [4, 10].

The crosstalk phenomenon is characterized by large high-frequency spikes and oscillations on the interfered device's gate voltage. The fast switching generates high dv/dt and di/dt, which would pass through the Miller capacitance, inducing high-frequency spikes and oscillations on the gate voltage [11, 12]. Severe spikes and oscillations may lead to false triggers and additional switching losses, even lead to shooting thorough [9]. Moreover, overshoot and undershoot of the gate voltage are critical parameters that influence the switching-induced drift of gate threshold voltage [13-15]. Crosstalk is the critical element for the switching behavior of SiC and GaN devices [16-18].

As the interface between power circuits and logic control circuits, gate drives significantly affect devices' behavior, including the crosstalk phenomenon. However, the conventional gate drive with the fixed drive resistor must tradeoff between switching behaviors, such as switching speed, switching loss, switch stresses, and crosstalk suppression [19,20]. Introducing auxiliary passive components for crosstalk suppression also should tradeoff between switching behaviors to obtain superior performance [19]. Hence, introducing auxiliary active devices into the gate drive circuit, researchers propose various active gate drives to suppress SiC and GaN Devices crosstalk.

Literature [21] proposed two kinds of active gate drives, namely, Gate Impedance Regulation (GIR) and Gate Voltage Control (GVC). GIR predicts the variation trend of induced gate voltage and controls the auxiliary active device preemptively to reduce the gate impedance during the switching transients. Once its gate impedance becomes small during the switching transient, most displacement current will be bypassed by the gate loop, resulting in less current that would induce spurious gate voltage. Thus, crosstalk is mitigated. Similarly, GVC also predicts the variation trend of induced gate voltage. What is different is that GVC preemptively charges the gate-source capacitance before the switching transients to offset the induced voltage. In the follow-up research, literature [22] proposed the Intelligent Gate Drive (IGD). IGD has a gate assist circuit consisting of two auxiliary transistors with two diodes. By predicting the switching behavior, the assist circuits preemptively control the gate voltage and gate loop impedances. However, the complex auxiliary logic circuits are needed for detecting the induced gate voltage, or for predicting the variation trend of the induced gate voltage, to take preemptive action. However, from the end-users' point of view, additional complexity is added along with the reliability concern due to extra components. Thus, the acceptance and adoption of these advanced gate drive techniques are limited. The fixed operation cannot self-adaptive following the increase of dv/dt ratings to ensure real-time control and robustness against parameter uncertainty. Active Miller Clamp (AMC) [11, 12, 23] is a typical active gate drive to attenuate crosstalk and is widely used in commercial gate drive chips. The gate voltage is detected and the auxiliary clamp device is activated preemptively when the gate voltage drops below a threshold voltage, a value relative to the turn-off bias voltage. It is the detected gate voltage that is used to identify the existence of crosstalk. However, the detected gate voltage peaks are less than that across the internal gate-source terminals because of the relatively large internal gate resistance of the devices [21]. Moreover, due to the circuit propagation delay, the clamping bandwidth is not high enough for the crosstalk suppression [11, 21]. On the other hand, due to the high switching speed, the detected gate voltage is interfered with mainly by the common-source inductance between the drive loop and power loop, which is inevitable in practical situations [21]. AMC technique shows a significant crosstalk suppression with lower dv/dt ratings; However, some limitations and enlarged disturbance are visible at higher dv/dt, for example, higher than around 20 V/ns in the test bench used in the literature [11].

With a crosstalk suppression control that features a preemptive action, the existing active gate drive is mainly based on the feed forward architecture [24]. Besides the drive circuit, auxiliary logic circuits are needed for detecting the induced gate voltage or for predicting the variation trend of the induced gate voltage to take preemptive action. However, additional complexity is added along with the reliability concern due to extra components. Thus, the acceptance and adoption of these advanced gate drive techniques are limited. Furthermore, in the active gate drive based on the feed forward control architecture, the gate voltage follows the drive's output in an open-loop way. It operates fixedly, pre-set based on switching behavior prediction. The prediction is not always accurate, especially in a fast switching condition, due to detection deviation, propagation delay and parasitic inductances. The fixed operation cannot self-adaptive following the increase of dv/dt ratings to ensure real-time control and robustness against parameter uncertainty. The active gate drive based on the feedback control architecture naturally attracts the attention of researchers in this area.

The negative feedback control is initially implemented in the active gate drive for switching slew rate control [25] in the drive of Si power devices. The feedback control is implemented by high bandwidth analog circuits [26, 27] or digital approaches, such as field-programmable gate array with high-speed, high-resolution D/A and A/D conversion [28, 29]. High dv/dt and di/dt can result in crosstalk phenomenon with gate glitch, false-triggering, and other detrimental effects during switching transients. Unlike the design criterion of active gate drivers for Si power devices, crosstalk suppression for gate voltage stability is critical for SiC and GaN devices because of their low threshold voltage and considerable internal gate resistance. Several researchers have investigated the SiC or GaN based switching transition negative feedback control by either electrical approach [30]

or optical approach [31, 32] but with relatively slow switching speed. Also, limited feedback control works focus on crosstalk suppression.

The implementation of negative feedback control in fast switching SiC and GaN devices for crosstalk suppression is challenging. Firstly, considering the switching time for SiC and GaN devices is as short as tens of nanoseconds, the propagation delay of the feedback control is a concern since it may be comparable, even longer than the switching time. Secondly, fast switching is always associated with parasitic ringing so that sensors that attempt to identify different switching subintervals easily interfere, resulting in improper operation. Generally, a high switching speed is desired due to the lower switching loss. However, coordinated optimization of gate voltage stability and switching speed is challenging.

This paper proposes a negative feedback active gate drive (NFAGD) employing one auxiliary P-channel MOSFET and one auxiliary capacitor together with the drive resistor for fast switching and crosstalk suppression base on the negative feedback control mechanism. The combined operation mechanism based on negative feedback control in the drive-semiconductor system is given to show the basic operation principle of the proposed gate drive. This paper then shows a design reference and experimental test results with commercial 1200V SiC MOSFETs to demonstrate the validity and effectiveness of the proposed methodology.

The referred literatures are listed below:
[1] J. Millan, P. Godignon, X. Perpina, A. Perez-Tomas, and J. Rebollo, "A Survey of Wide Bandgap Power Semiconductor Devices," A Survey of Wide Bandgap Power Semiconductor Devices, vol. 29, pp. 2155-2163, 2014.
[2] D. Tan, "Emerging System Applications and Technological Trends in Power Electronics: Power Electronics is Increasingly Cutting Across Traditional Boundaries," Emerging System Applications and Technological Trends in Power Electronics: Power Electronics is Increasingly Cutting Across Traditional Boundaries, vol. 2, pp. 38-47, 2015-01-01 2015.
[3] A. Bindra, "Wide-Bandgap-Based Power Devices: Reshaping the Power Electronics Landscape," Wide-Bandgap-Based Power Devices: Reshaping the Power Electronics Landscape, vol. 2, pp. 42-47, 2015.
[4] F. Wang and Z. Zhang, "Overview of Silicon Carbide Technology: Device, Converter, System, and Application," Overview of Silicon Carbide Technology: Device, Converter, System, and Application, vol. 1, pp. 13-32, 2016.
[5] F. Wang, Z. Zhang and E. A. Jones, *Characterization of Wide Bandgap Power Semiconductor Devices*. Croydon, UK: CPI Group (UK) Ltd, 2018.
[6] Y. Ren, M. Xu, J. Zhou, and F. C. Lee, "Analytical Loss Model of Power MOSFET," Analytical Loss Model of Power MOSFET, vol. 21, pp. 310-319, 2006.
[7] M. Liang, T. Q. Zheng, C. Ke, Y. Li, and X. You, "Performance Comparison of SiC MOSFET, Si Cool MOS and IGBT for DAB Converter," Performance Comparison of SiC MOSFET, Si Cool MOS and IGBT for DAB Converter, vol. 30, pp. 41-50, 2015.
[8] R. Bosshard and J. W Kolar, "All-SiC 9.5 kW/dm³ On-Board Power Electronics for 50 kW/85 kHz Automotive IPT System," All-SiC 9.5 kW/dm³ On-Board Power Electronics for 50 kW/85 kHz Automotive IPT System, vol. 5, pp. 419-431, 2017.
[9] Z. Zhang, B. Guo and F. Wang, "Evaluation of Switching Loss Contributed by Parasitic Ringing for Fast Switching Wide Band-Gap Devices," Evaluation of Switching Loss Contributed by Parasitic Ringing for Fast Switching Wide Band-Gap Devices, vol. 34, pp. 9082-9094, 2019.
[10] Z. Zhang, B. Guo, F. F. Wang, E. A. Jones, L. M. Tolbert, and B. J. Blalock, "Methodology for Wide Band-Gap Device Dynamic Characterization," Methodology for Wide Band-Gap Device Dynamic Characterization, vol. 32, pp. 9307-9318, 2017.
[11] STMicroelectronics AN-5355, "Mitigation Technique of the SiC MOSFET Gate Voltage Glitches with Miller Clamp,", 2019.
[12] Avago Technologies AN-5314, "Active Miller Clamp,", 2010.
[13] T. Aichinger, G. Rescher and G. Pobegen, "Threshold Voltage Peculiarities and Bias Temperature Instabilities of SiC MOSFETs," Threshold Voltage Peculiarities and Bias Temperature Instabilities of SiC MOSFETs, vol. 80, pp. 68-78, 2018.
[14] D. Peters, T. Aichinger, T. Basler, G. Rescher, K. Puschkarsky, and H. Reisinger, "Investigation of Threshold Voltage Stability of SiC MOSFETs," in 2018 *IEEE 30th International Symposium on Power Semiconductor Devices and ICs (ISPSD)*, Chicago, USA, 2018, pp. 40-43.
[15] Infineon Technologies AN-2018-09, "Guidelines for CoolSiC™ MOSFET Gate Drive Voltage Window,", 2018.
[16] Z. Zhang, W. Zhang, F. Wang, L. M. Tolbert, and B. J. Blalock, "Analysis of the Switching Speed Limitation of Wide Band-Gap Devices in a Phase-Leg Configuration," in 2012 *IEEE Energy Conversion Congress and Exposition (ECCE)* Raleigh, USA: IEEE, 2012, pp. 3950-3955.
[17] T. Shao, Z. Li, T. Q. Zheng, H. Li, B. Huang, Z. Wang, and Z. Zhang, "Impact of Common Source Inductance on the Gate-Source Voltage Negative Spike of SiC MOSFET in Phase-Leg Configuration," in 2020 *IEEE 9th International Power Electronics and Motion Control Conference (IPEMC2020-ECCE Asia)* Nanjing, China, 2020.
[18] T. Shao, Z. Li, Z. Wang, T. Q. Zheng, H. Li, B. Huang, and Z. Zhang, "Induced Gate-Source Voltage Mechanism and Gate Driver Design in All-SiC PWM Rectifier with Ultra-High Voltage Slew Rate (dv/dt)," in 2020 *IEEE 9th International Power Electronics and Motion Control Conference (IPEMC2020-ECCE Asia)* Nanjing, China, 2020.
[19] Z. Zeng and X. Li, "Comparative Study on Multiple Degrees of Freedom of Gate Drivers for Transient Behavior Regulation of SiC MOSFET," Comparative Study on Multiple Degrees of Freedom of Gate Drivers for Transient Behavior Regulation of SiC MOSFET, vol. 33, pp. 8754-8763, 2018.
[20] N. Oswald, P. Anthony, N. McNeill, and B. H. Stark, "An Experimental Investigation of the Tradeoff between Switching Losses and EMI Generation with Hard-Switched All-Si, Si—SiC, and All-SiC Device Combinations," An Experimental Investigation of the Tradeoff between Switching Losses and EMI Generation with Hard-Switched All-Si, Si—SiC, and All-SiC Device Combinations, vol. 29, pp. 2393-2407, 2014.
[21] Z. Zhang, F. Wang, L. M. Tolbert, and B. J. Blalock, "Active Gate Driver for Crosstalk Suppression of SiC Devices in a Phase-Leg Configuration," Active Gate Driver for Crosstalk Suppression of SiC Devices in a Phase-Leg Configuration, vol. 29, pp. 1986-1997, 2014.
[22] Z. Zhang, J. Dix, F. Wang, B. J. Blalock, D. Costinett, and L. M. Tolbert, "Intelligent Gate Drive for Fast Switching and Crosstalk Suppression of SiC Devices,"

Intelligent Gate Drive for Fast Switching and Crosstalk Suppression of SiC Devices, vol. 32, pp. 9319-9332, 2017.

[23] Z. Chen, M. Danilovic, D. Boroyevich, and Z. Shen, "Modularized Design Consideration of a General-Purpose, High-Speed Phase-Leg PEBB Based on SiC MOSFETs," in *Proceedings of the 2011 14th European Conference on Power Electronics and Applications* Birmingham, U K, 2011, pp. 1-10.

[24] G. C. Goodwin, S. F. Graebe and M. E. Salgado, *Control System Design*: Pearson, 2000.

[25] S. Zhao, X. Zhao, Y. Wei, Y. Zhao, and H. A. Mantooth, "A Review On Switching Slew Rate Control for Silicon Carbide Devices Using Active Gate Drivers," A Review On Switching Slew Rate Control for Silicon Carbide Devices Using Active Gate Drivers, 2020-07-09 2020.

[26] Z. Wang, X. Shi, L. M. Tolbert, F. Wang, and B. J. Blalock, "A di/dt Feedback-Based Active Gate Driver for Smart Switching and Fast Overcurrent Protection of IGBT Modules," A di/dt Feedback-Based Active Gate Driver for Smart Switching and Fast Overcurrent Protection of IGBT Modules, vol. 29, pp. 3720-3732, 2014.

[27] Y. Lobsiger and J. W. Kolar, "Closed-Loop Di/Dt and Dv/Dt IGBT Gate Driver," Closed-Loop Di/Dt and Dv/Dt IGBT Gate Driver, vol. 30, pp. 3402-3417, 2015.

[28] L. Michel, X. Boucher, A. Cheriti, P. Sicard, and F. Sirois, "FPGA Implementation of an Optimal IGBT Gate Driver Based on Posicast Control," FPGA Implementation of an Optimal IGBT Gate Driver Based on Posicast Control, vol. 28, pp. 2569-2575, 2013.

[29] L. Dang, H. Kuhn and A. Mertens, "Digital Adaptive Driving Strategies for High-Voltage IGBTs," Digital Adaptive Driving Strategies for High-Voltage IGBTs, vol. 49, pp. 1628-1636, 2013.

[30] H. Riazmontazer, A. Rahnamaee, A. Mojab, S. Mehrnami, S. K. Mazumder, and M. Zefran, "Closed-Loop Control of Switching Transition of SiC MOSFETs," in *2015 IEEE Applied Power Electronics Conference and Exposition (APEC)*, 2015, pp. 782-788.

[31] H. Riazmontazer and S. K. Mazumder, "Dynamic Optical Turn-Off Control of a High-Voltage SiC MOSFET," in *2013 Twenty-Eighth Annual IEEE Applied Power Electronics Conference and Exposition (APEC)*, 2013, pp. 1274-1278.

[32] A. Meyer, S. K. Mazumder and H. Riazmontazer, "Optical Control of 1200-V and 20-A SiC MOSFET," in *2012 Twenty-Seventh Annual IEEE Applied Power Electronics Conference and Exposition (APEC)*, 2012, pp. 2530-2533.

[33] K. Ogata, *System Dynamics Fourth Edition*: Prentice-Hall, 2004.

SUMMARY OF THE INVENTION

The technical issue to be solved by the present invention is to provide a power MOSFET gate drive based on negative feedback mechanism, which can automatically suppress the induced gate voltage, or the so-called crosstalk, without sacrificing the switching speed and without increasing circuit complexity of a MOSFET.

The objective of the present invention is achieved by providing a MOSFET gate drive based on the negative feedback mechanism. The gate drive is used to connect the drive signal to enable or disable the switching action of the controlled MOSFET, comprising: an auxiliary MOSFET, being a P-channel MOSFET, and having its source connected to the gate of the controlled MOSFET for creating a negative feedback regulating mechanism, the auxiliary MOSFET having its drain connected to a drive voltage; the drive voltage is the output voltage of a push-pull drive circuit (usually realized by a conventional gate drive chip along with its power supplies) that has been filtered by a passive network which comprises a drive resistor R and an auxiliary capacitor C.

Moreover, the circuit further comprises:

(1) a first node, a second node, and a third node;

(2) a push-pull drive circuit, for providing a driving current to drive the controlled MOSFET, the drive signal being connected to the conventional gate drive chip or to a totem-pole circuit, forming the push-pull drive circuit, and the push-pull drive circuit and the third node being connected in series;

(3) a drive resistor R, having one end connected in series with the push-pull drive circuit, and having an opposite end connected to the first node, for limiting a charging/discharging current applied to an auxiliary capacitor C by the push-pull drive circuit;

(4) a voltage difference between the first node and a source of the controlled MOSFET being the drive voltage;

(5) an auxiliary capacitor C, having one end connected to the first node and having an opposite end connected to the source of the controlled MOSFET through the third node, so as to work with the drive resistor R to form the passive network for regulating a switching speed of the controlled MOSFET;

(6) the drain and the gate of the auxiliary MOSFET connect in series with the drive resistor R through the second node, the source of the auxiliary MOSFET is connected to the gate of the controlled MOSFET for creating the negative-feedback regulating mechanism.

Further, the push-pull drive circuit comprises: a conventional gate drive chip; an on-bias voltage $V_{CC}$ and an off-bias voltage $V_{EE}$. The conventional gate drive chip having a positive supply terminal (the output side of isolation) connected to the positive pole of the on-bias voltage $V_{CC}$, the conventional gate drive chip having a positive supply terminal (the output side of isolation) connected to the negative pole of the off-bias voltage $V_{EE}$, the conventional gate drive chip having a drive output terminal connected to one end of the drive resistor R and having a drive input terminal connected to the drive signal; and a negative pole of the on-bias voltage $V_{CC}$ and a positive pole of the off-bias voltage $V_{EE}$ both being connected to the third node. The conventional gate drive chip has a maximum permissible output current not smaller than $(V_{CC}-V_{EE})/R_g$, where $R_g$ is the internal gate resistance of the controlled MOSFET.

Further, the auxiliary MOSFET has a drain-source breakdown voltage not smaller than $V_{CC}-V_{EE}$, and has a maximum permissible continuous drain current not smaller than $(V_{CC}-V_{EE})/R_g$.

The present invention has the following advantages. The negative feedback active gate drive (NFAGD) has a simple structure and easy to be realized using a conventional gate drive chip, a drive resistor, an auxiliary MOSFET and an auxiliary capacitor, without involving any additional logical circuits. Functionally, the negative feedback active gate drive (NFAGD) can automatically suppress the induced gate-source voltage and make the gate voltage of the MOSFET stable even during high-speed switching operation without sacrificing the switching speed of the MOSFET. In subsequent embodiments, compared to conventional passive suppression approaches, the negative feedback active gate drive (NFAGD) provides greater suppression of gate-source voltage spikes and oscillation. It can suppress the crosstalk without influencing the switching speed, thus enables coordinated optimization of gate voltage stability and switching behavior.

BRIEF DESCRIPTION OF THE DRAWINGS

The invention will be best understood by reference to the following detailed description of illustrative embodiments when read in conjunction with the accompanying drawings.

DETAILED DESCRIPTION OF THE INVENTION

One mode for implementing the present invention is now described.

Figure 1:
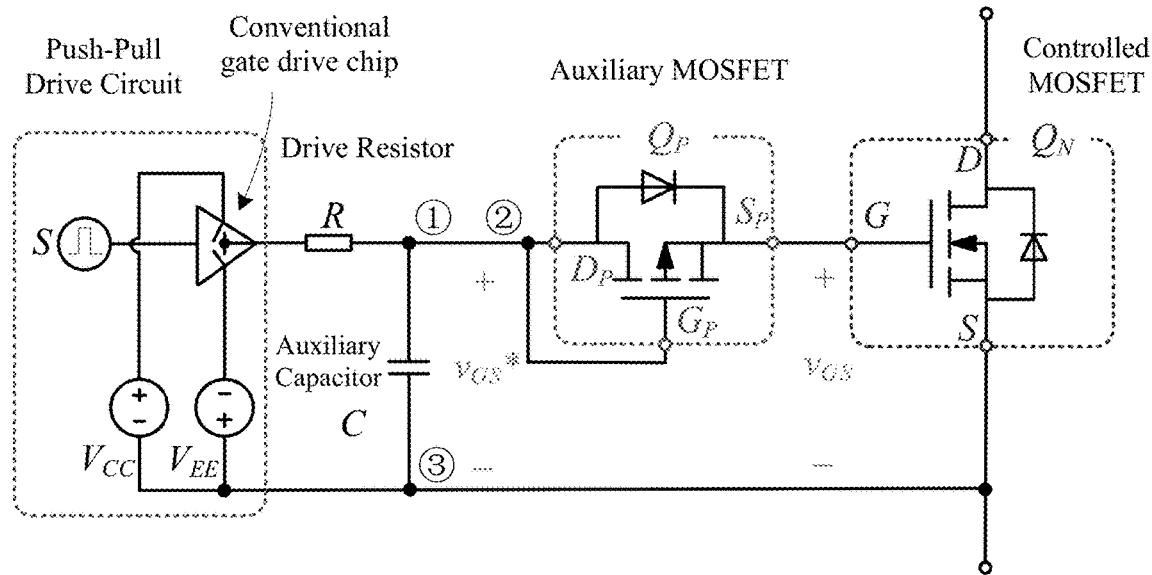
FIG. 1 is a circuit diagram of a negative feedback active gate drive (NFAGD) of the present invention.

As shown in FIG. 1, a negative feedback active gate drive (NFAGD) is used to drive a MOSFET $Q_N$. The output of a conventional gate MOSFET drive is connected to a network, constituted by the drive resistor R and the auxiliary capacitor C. The output of the RC network is also regarded as the drive reference vGS*. It then goes to the gate and source of controlled MOSFET through the auxiliary MOSFET. For building the negative feedback, the controlled MOSFET and auxiliary MOSFET should have a complementary channel characteristic. Usually, the controlled MOSFET is N-channel. Hence the auxiliary MOSFET is P-channel. Hereafter, this invention denotes the controlled MOSFET and auxiliary MOSFET as QN and QP. The RC network is responsible for tuning the speed of switching. The gate voltage vGS would follow the drive reference vGS*, owing to the negative feedback control. Hence the speed of gate voltage vGS is similar to that of the drive reference vGS*.

Figure 2:
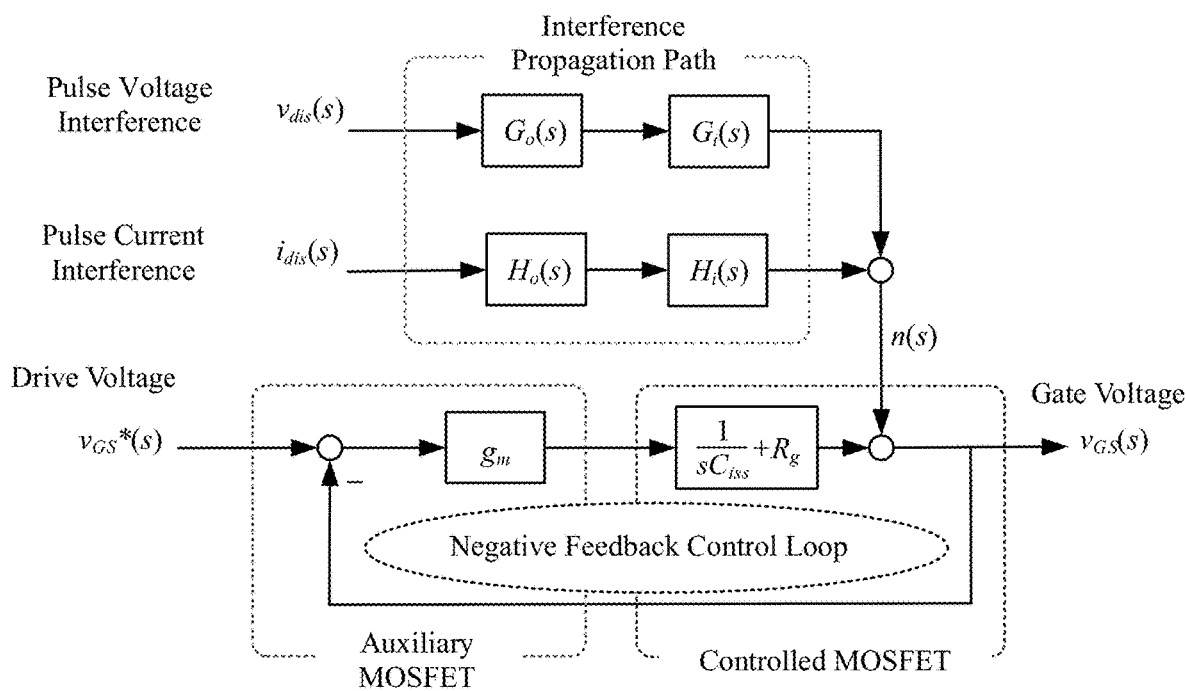
FIG. 2 is a block diagram showing control of the negative feedback active gate drive (NFAGD) of the present invention.

FIG. 2 illustrates the negative feedback regulating mechanism possessed by the circuit of the present invention. The analysis is based on two simplifications to explain the mathematical nature of NFAGD for understanding. Firstly, the transconductance gain of the auxiliary MOSFET $Q_P$ is treated as a non-time-varying constant $g_m$. The reverse transconductance gain of the parasitic body diode (the slope of the output characteristic curve) is also expressed by $g_m$. Secondly, the reverse conducting threshold voltage of the auxiliary MOSFET $Q_P$ is equal to its forward conducting threshold voltage, and both are denoted $V_{th}$. The close-loop transfer function of the NFAGD can be derived from the block diagram shown in FIG. 1, given as:

$$\Phi(s) = \frac{v_{GS}(s)}{v_{GS}*(s)} = \frac{G(s)}{1+G(s)} \qquad (1)$$

Where G(s) is the open-loop transfer function of NFAGD, given as:

$$G(s) = g_m\left(\frac{1}{sC_{ss}} + R_g\right) = \frac{g_m}{C_{iss}} \frac{sR_g C_{iss} + 1}{s} \qquad (2)$$

According to the system dynamic theory, the NFAGD is a unity-feedback type 1 control system. The open-loop gain is $g_m/C_{iss}$. Static velocity error constant can be expressed as:

$$K_v = \lim_{s \to 0} sG(s) = \frac{g_m}{C_{iss}} \qquad (3)$$

In general, the input capacitance of controlled MOSFET ($C_{iss}$) is about several nano-farads. Simultaneously, the transconductance gain of the auxiliary MOSFET ($g_m$) is far larger than 1 Siemens, therefore under the international system of units, we can get $g_m \gg C_{iss}$, so the static velocity error constant $K_v$ is large enough. Therefore, when the gate voltage $v_{GS}$ tracks the ramping drive reference $v_{GS}*$, the deviation between them is small enough and does not affect the turn-on and turn-off of the controlled SiC MOSFET following the designer's request. Moreover, due to the large static velocity error constant $K_v$, the suppression ratio of the disturbance n(s) is large enough to attenuate the induced spikes and oscillations on gate voltage $v_{GS}(s)$.

Figure 3:
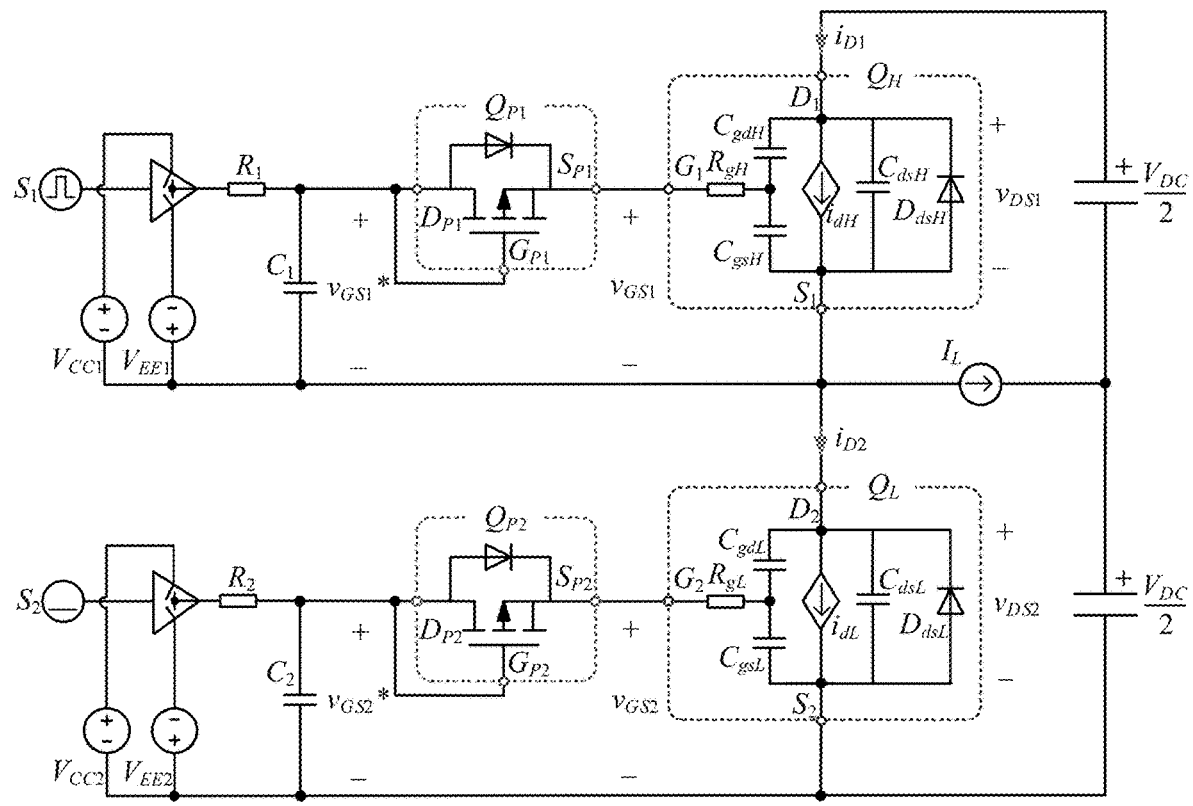
FIG. 3 depicts a negative feedback active gate drive in a phase-leg structure according to one embodiment of the present invention.

As shown in FIG. 3, the depicted embodiment shows a negative feedback active gate drive (NFAGD) used in a phase-leg structure. To facilitate the reader to understand the working principle, it demonstrates the controlled SiC MOSFETs ($Q_H$ and $O_L$) with the junction capacitors, representing the devices' dynamic characteristics. The meaning of each symbol in FIG. 3 is similar to that shown in FIG. 1. Only to distinguish upper and lower devices, adding marks "1" and "2" respectively, or marks "L" and "H". $R_1$ and $R_2$ represent the drive resistor of the upper and lower devices, respectively. $C_1$ and $C_2$ represent the auxiliary capacitor of the upper and lower devices, respectively. $Q_{P1}$ and $Q_{P2}$ represent the auxiliary MOSFET of the upper and lower devices, respectively. As the active device in the phase-leg, $Q_H$ is turning on and off under the control of signal $S_1$. $Q_L$ is the non-active device in the phase-leg, and its control signal $S_2$ steady at a low level to keep the channel of $Q_L$ turning off and only its parasitic body diode is used for freewheeling.

The miller capacitances $C_{gdH}$ and $C_{gdL}$ of the controlled MOSFETs decrease with their drain voltage. For understanding, the analysis introduces the piecewise linearization curve to approximate the actual curve for simplification. When the drain voltage is larger than the gate voltage, the value of miller capacitance is $C_{gd1}$. When the drain voltage is less than the gate voltage, the value of miller capacitance is $C_{gd2}$. The output current at the midpoint of the phase-leg is approximately constant during the switching process and represented by $I_L$.

Figure 4A:
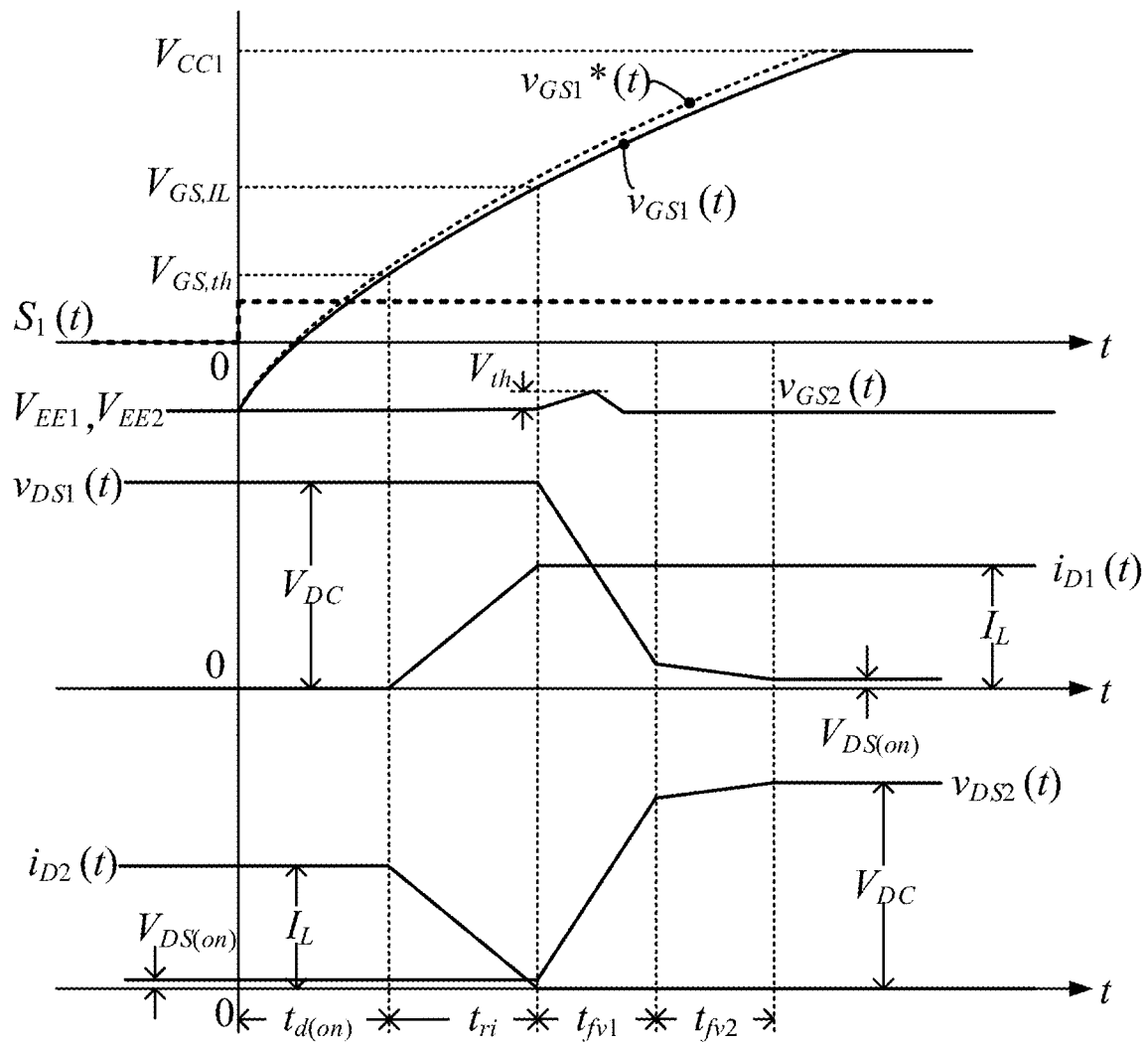
FIG. 4a is a schematic waveform diagram during the turning on process of $Q_H$ using the negative feedback active gate drive.
Figure 4B:
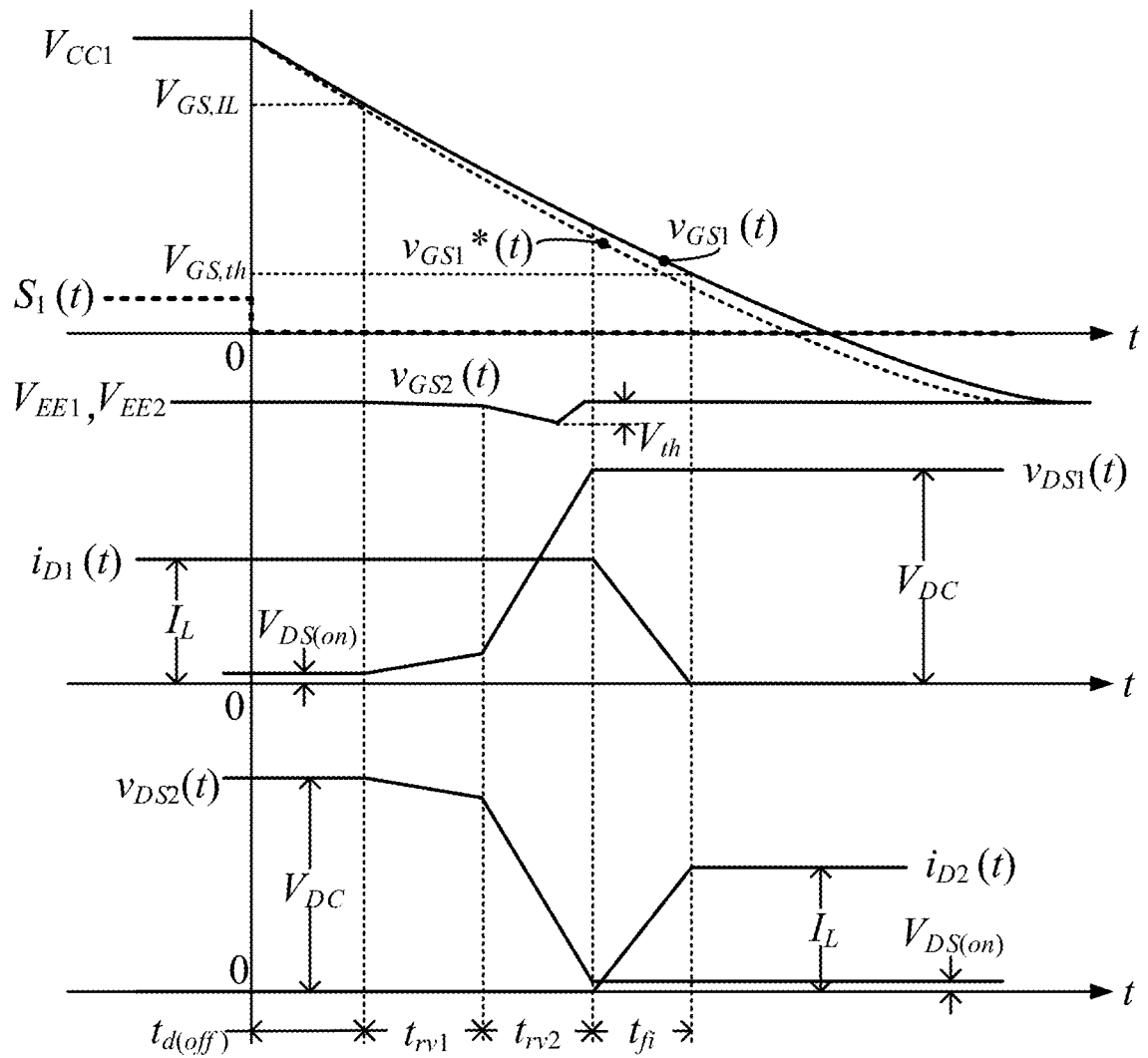
FIG. 4b is a schematic waveform diagram during the turning off process of $Q_H$ using the negative feedback active gate drive.

FIG. 4a and FIG. 4b show theoretical waveforms of the circuit of FIG. 3 in the dynamic processes of turning on and off $Q_H$, with the initial moments being the moment when $S_1$ changes from the low level to the high level and the moment when $S_1$ changes from the high level to the low level, respectively. The two dynamic processes each have 4 modes, which will be detailed below:

Turning on $Q_H$, as shown in FIG. 4a

Turn-on mode 1: during the turn-on delay time $t_{d(on)}$. At t=0 time point, $S_1$ changes from low level to high level. The driver IC charges $C_1$ through $R_1$. Hence, the drive voltage $v_{GS1}$* increases, gradually rising from $V_{EE1}$ to $V_{CC1}$. Because of the negative feedback mechanism, the gate voltage $v_{GS1}$ tracks $v_{GS1}$* and also increases gradually. It should be noticed that, as mentioned above, the NFAGD system is a unity-feedback type 1 control system. There is some error in the tracking of the ramping drive reference $v_{GS1}$*. The tracking error will not affect the regular operation due to the large value of the static velocity error constant. In this mode, since $v_{GS1}$ is still less than the threshold voltage $V_{GS,th}$, the channel of $Q_H$ is in the off-state, $i_{D1}$=0 can be got. $V_{DS1}$ stands still at $V_{DC}$, and this mode ends when $v_{GS1}$ reaches $V_{GS,th}$.

Turn-on mode 2: during the current rise time $t_{ri}$, $V_{GS1}$ starts from the threshold voltage $V_{GS,th}$, and rises to $V_{GS,IL}$, which indicates the value of $v_{GS1}$ that can maintain channel current at $I_L$. $V_{DS1}$ stands still at $V_{DC}$. The current $i_{D1}$ rises from 0 to $I_L$. During this process, due to the decrease of the passive device's current $i_{D2}$, the gate voltage of $Q_L v_{GS2}$ increases slightly but not large enough to trigger the conduction of $Q_{P2}$. The mode ends at the moment when the current $i_{D1}$ rises to $I_L$.

Turn-on mode 3: during the first voltage decrease time $t_{fv1}$, the gate voltage of $Q_H(v_{GS1})$ still tracks $v_{GS1}$* as the negative feedback controls. The drive circuit continues to charge $C_{gdH}$ and $C_{gsH}$ through the active control of auxiliary MOSFET. This charging current weakens the influence of the miller effect on the gate voltage. The miller platform appears for a very short time, which is not apparent in the waveform. In this mode, $v_{DS1}$ falls from $V_{DC}$. Since the drain voltage is still larger than the gate voltage, the value of $C_{gdH}$ is still relatively small ($C_{gd1}$). Therefore $v_{DS1}$ falls at a relatively fast rate at this stage. $Q_L$'s drain voltage ($v_{DS2}$) rises rapidly, which induces $Q_L$'s gate voltage ($v_{GS2}$) rises significantly. Due to the negative feedback mechanism, when the electric potential of $S_{P2}$ is higher than that of $D_{P2}$ and the electric potential difference exceeds the threshold voltage $V_{th}$, leading to the conduct of $Q_{P2}$. Then the drive IC discharges the input capacitance of $Q_L(C_{issL})$ through the channel of $Q_{P2}$. Hence the $Q_L$'s gate voltage $v_{GS2}$ decreases, returning to $V_{EE2}$ and the disturbance is suppressed. This mode ends when $v_{DS1}$ falls to a value equal to $v_{GS1}$.

Turn-on mode 4: during the second voltage decrease time $t_{fv2}$, due to the negative feedback mechanism, the gate voltage $v_{GS1}$ still rises along with $v_{GS1}$*, instead of remaining unchanged at $V_{GS,IL}$. $v_{DS1}$ continues to fall. Since the drain voltage is less than the gate voltage, the value of $C_{gdH}$ is relatively large ($C_{gd2}$), and the falling rate of $v_{DS1}$ in this stage is relatively slow. This mode ends when $v_{DS1}$ descends to $V_{DS(on)}$.

After the turn-on mode 4, due to the negative feedback mechanism, the gate voltage $v_{GS1}$ still rises to the bias voltage $V_{CC1}$, tracking its drive reference signal $v_{GS1}$*. At this moment, the turn-on process is finally completed.

Turning off $Q_H$, as shown in FIG. 4b

Turn-off mode 1: during the turn-off delay time $t_{d(off)}$. At t=0 time point, $S_1$ changes from high level to low level. The driver IC discharges $C_1$ through $R_1$. Hence, the drive voltage $v_{GS1}$* decreases, gradually falling from $V_{CC1}$ to $V_{EE1}$. Because of the negative feedback mechanism, the gate voltage $v_{GS1}$ tracks $v_{GS1}$* and also decreases gradually. It should be noticed that, as mentioned above, the NFAGD system is a unity-feedback type 1 control system. There is some error in the tracking of the ramping drive reference $v_{GS1}$*. The tracking error will not affect the regular operation due to the large value of the static velocity error constant. In this mode, since $v_{GS1}$ is still larger than the threshold voltage $V_{GS,th}$, the channel of $Q_H$ is in the on-state, $i_{D1}$=$I_L$ can be got. $V_{DS1}$ stands still at $V_{DS(on)}$, and this mode ends when $v_{GS1}$ reaches $V_{GS,IL}$.

Turn-off mode 2: during the first voltage rise time $t_{rv1}$, the gate voltage of $Q_H(v_{GS1})$ still tracks $v_{GS1}$* as the negative feedback controls. The drive circuit continues to discharge $C_{gdH}$ and $C_{gsH}$ through the active control of auxiliary MOSFET. This charging current weakens the influence of the miller effect on the gate voltage. The miller platform appears for a very short time, which is not apparent in the waveform. In this mode, $v_{DS1}$ rises from $V_{DS(on)}$. Since the drain voltage is still less than the gate voltage, the value of $C_{gdH}$ is still relatively large ($C_{gd2}$). Therefore $v_{DS1}$ rises at a relatively slow rate at this stage. This mode ends when $v_{DS1}$ rises to a value equal to $v_{GS1}$.

Turn-off mode 3: during the second voltage rise time $t_{rv2}$, due to the negative feedback mechanism, the gate voltage $v_{GS1}$ still decreases along with $v_{GS1}$*. $v_{DS1}$ continues to increase. Since the drain voltage is larger than the gate voltage, the value of $C_{gdH}$ is relatively small ($C_{gd1}$), and the rising rate of $v_{DS1}$ in this stage is relatively fast. $Q_L$'s drain voltage ($v_{DS2}$) falls rapidly, which induces $Q_L$'s gate voltage ($v_{GS2}$) to fall significantly. Due to the negative feedback mechanism, when the electric potential of $D_{P2}$ is higher than that of $S_{P2}$ and the electric potential difference exceeds the threshold voltage of the parasitic body diode of $Q_{P2}$. The drive IC charges the input capacitance of $Q_L$ ($C_{issL}$) through the parasitic body diode of $Q_{P2}$. Hence the $Q_L$'s gate voltage $v_{GS2}$ increases, returning to $V_{EE2}$ and the disturbance is suppressed. This mode ends when $v_{DS1}$ rises to a value equal to $V_{DC}$.

Turn-off mode 4: during the current fall time $t_{fi}$, due to the negative feedback mechanism, the gate voltage $v_{GS1}$ still falls along with $v_{GS1}^*$ until it reaches $V_{GS,th}$. In this mode, $v_{DS1}$ remains unchanged in $V_{DC}$. This mode ends when $i_{D1}$ falls to 0.

After the turn-off mode 4, due to the negative feedback mechanism, the gate voltage $v_{GS1}$ still falls to the bias voltage $V_{EE1}$, tracking its drive reference signal $v_{GS1}^*$. At this moment, the turn-off process is finally completed.

The exemplary parameters for disclosed NFAGD are designed with the following considerations.

To better understand the combined operation mechanism based on negative feedback control in the drive-semiconductor system, this paper would also show the design principle of the negative feedback active gate drive (NF-AGD).

A. Selection Principle for the Controlled SiC MOSFET

When adopting the NFAGD, the controlled SiC MOSFET should be determined according to the converters' operation condition, like the conventional semiconductor power device derived by other drive circuits. Generally, the SiC MOSFET is selected by the maximum working voltage and current of the device to ensure a safe operating area. For example, in this paper's experiment, the 1200V SiC MOSFET IMZ120R030M1H with high commercialization degree in high power conditions is selected as the controlled SiC MOSFET demonstrate and verify the technical feasibility of the proposed method. The maximum drain-source voltage is 1200V, the maximum drain current 56 A, and the internal gate resistance is 3Ω.

B. Drive IC Selection and Peripheral Circuit Design Principles

The proposed NFAGD has the effect of stabilizing the gate voltage, attenuating the interference effects from the pulse voltage and pulse current. However, it does not eliminate the gate instability problem once for all. Considering the low threshold voltage of the controlled SiC MOSFET (approximately 2~4V), the negative turn-off bias voltage is critical. While the turn-on bias voltage usually relates to the on-state resistance, whose design should refer to a typical suggestion from the datasheet. This paper recommends the turn-on bias voltage $V_{CC}$=15~22V and turn-off bias voltage $V_{EE}$=−5~0V. Based on the above considerations, the bias voltages $V_{CC}$=20V and $V_{EE}$=−5V are adopted in the subsequent design.

This paper recommends the drive IC's isolation part has a common mode transient immunity CMTI≥100V/ns (within the full temperature range). The drive IC output current should be no less than $(V_{CC}-V_{EE})/R_g$, where $R_g$ is the internal gate resistance of the controlled SiC MOSFET. For example, the selected controlled SiC MOSFET (IMZ120R030M1H) internal gate resistance $R_g$=3Ω, the bias voltages $V_{CC}$=20V and $V_{EE}$=−5V is adopted. In one implementation, the drive chip used is 1ED3124MU12H with an output current up to 14 A.

C. Selection Principle for the Auxiliary MOSFET

The auxiliary MOSFET is the P-channel MOSFET with a relatively low voltage rating in the drive circuit without flowing through a large current and endues large voltage. Meanwhile, to ensure the control accuracy, the transconductance gain ($g_m$) of the auxiliary MOSFET should be larger than 1 Siemens. The auxiliary MOSFET bears a certain current and voltage during the switching transients of the controlled SiC MOSFET. Hence, the auxiliary MOSFET's maximum current and voltage should be designed according to the bias voltages $V_{CC}$ and $V_{EE}$.

The auxiliary MOSFET is subjected to a certain level of voltage and current during the switching transients of the controlled SiC MOSFET. Hence the maximum voltage and current of the auxiliary MOSFET should be designed according to the bias voltages $V_{CC}$ and $V_{EE}$. We recommend the maximum voltage should be no less than $V_{CC}-V_{EE}$, the maximum current should be no less than $(V_{CC}-V_{EE})/R_g$. Based on the above analysis, FDS9435A is used as the P-channel auxiliary MOSFET, with a drain-source breakdown voltage of 30(V), a maximum permissible continuous drain current of 25 (A), and a transconductance gain of 10(S).

D. Design Principles for Auxiliary Capacitors and Drive Resistors

The auxiliary capacitor and the drive resistor (i.e., C and R in FIG. 1) connected to the output end of the push-pull drive circuit jointly determines the rising/falling speed of $v_{GS}$. Generally, the input capacitance of the controlled MOSFET is about the nF level, and the transconductance gain of the auxiliary MOSFET is much greater than 1(S). Therefore, the open-loop gain of the gate negative feedback active MOSFET-driving circuit is large enough. When $v_{GS}$ tracks the ramp-rising (falling) $v_{GS}^*$, the deviation between the two is quite small, and $v_{GS}^*$ and $v_{GS}$ have an approximately equal rising/falling speed. The auxiliary capacitor C also provides the function of decoupling, for shortening the "electrical circumference" of the loop composed of the output end of the push-pull drive circuit and the gates-sources of the auxiliary MOSFET and the controlled MOSFET. The recommended auxiliary capacitor C at a site of the power loop of the phase-leg circuit having an undamped self-sustained oscillation frequency has an impedance not greater than 0.2Ω, that is:

$$\frac{\sqrt{L_o C_{oss}}}{C} \le 0.2 \Rightarrow C \ge 5\sqrt{L_o C_{oss}}$$

In this embodiment, the controlled MOSFET (IMZ120R030M1H) has an output capacitance of $C_{oss}$=116 pF, and the stray inductance $L_o$ of the power loop is estimated to be 50 nH. According to the foregoing equation, the auxiliary capacitor C should not be smaller than 12 nF. Engineeringly, the selected auxiliary capacitor C=20 nF so as to ensure that the impedance at the site of the power loop having the undamped self-sustained oscillation frequency has an impedance that is small enough.

After the auxiliary capacitor C is selected, design of the drive resistor R can be started. The product of the drive resistor R and the auxiliary capacitor C is τ=RC, being the charging/discharging time constant of the resistance-capacitance circuit. The charging/discharging time constant τ is inversely proportional to the rising/descending slope of the gate-source voltage. In other words, the larger the charging/discharging time constant τ is, the slower the gate-source voltage rises/falls, in turn leading to slower switching speed of the controlled MOSFET. That means if a higher switching speed of the controlled MOSFET is desired, such as when it is needed to reduce loss and enhance efficiency, a smaller charging/discharging time constant τ is preferable. However, additional functional concerns of the drive resistor R are current limits and protection it provides for the push-pull drive circuit. At the beginning of the switching operation, the current of the push-pull drive circuit charging/discharging the auxiliary capacitor C through the drive resistor R reaches the peak $(V_{CC}-V_{EE})/R$. For making the most use of the loading budget of the drive chip selected to the present embodiment and realizing a relatively fast switching speed of the MOSFET, in the present embodiment, the charging/ discharging current peak ($V_{CC}$-$V_{EE}$)/R is such designed that it is 70% of the peak output current of the drive chip. In particular, the 70% of the maximum output current of maximum output current of 1ED3124MU12H with the on voltage $V_{CC}$=20V and the off voltage $V_{EE}$=−5V is about 10 A. Therefore, the drive resistor R=2.5Ω, and the corresponding charging/discharging time constant τ=50 nS. It is to be noted that the described design of the drive resistor R is illustrative, and in various industrial applications, the drive resistor may be flexibly designed otherwise and adapted to practical needs in terms of efficiency, loss, and electromagnetic compatibility, together with the selection of the auxiliary capacitor.

It is to be noted that the described design of the drive resistor R is illustrative, and in various industrial applications, the drive resistor may be flexibly designed otherwise and adapted to practical needs in terms of efficiency, loss, and electromagnetic compatibility, together with the selection of the auxiliary capacitor.

Figure 5A:
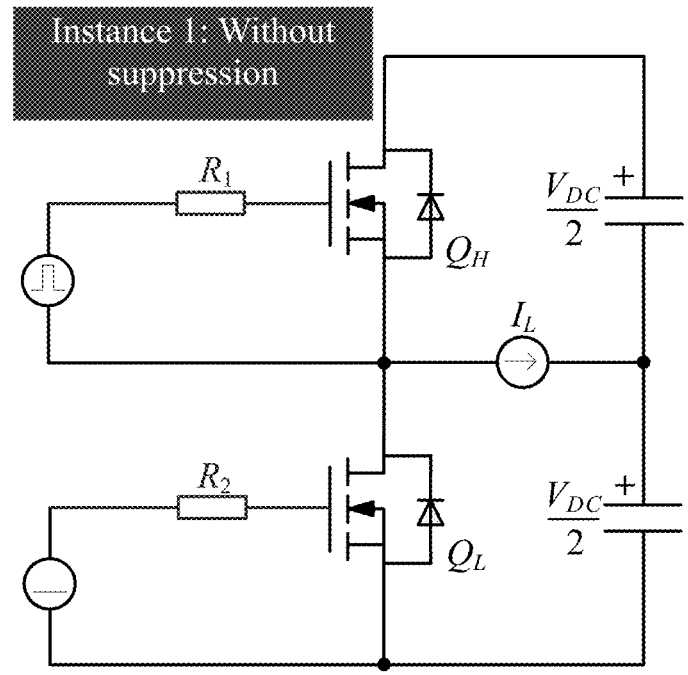
FIG. 5a is a diagram of an experimental circuit with the conventional gate drive without suppression for comparison with one embodiment of the present invention.
Figure 5B:
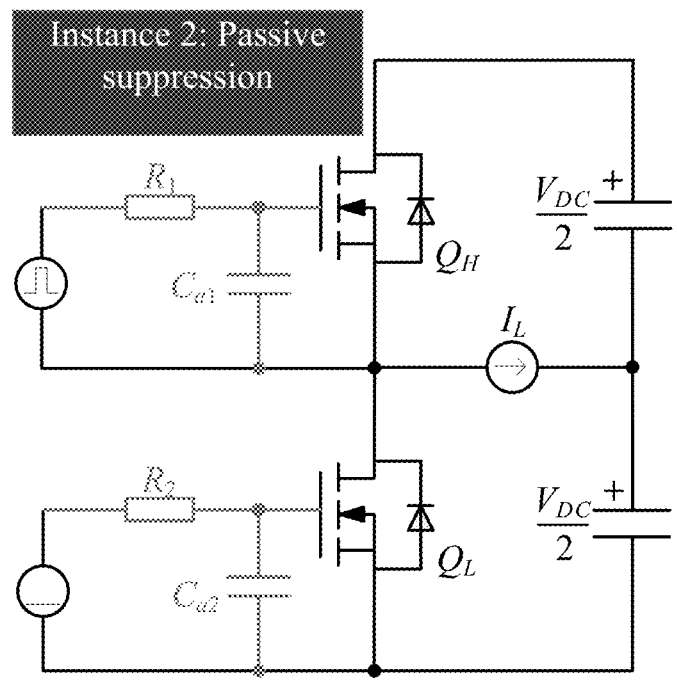
FIG. 5b is a diagram of an experimental circuit with the conventional gate drive that used passive suppression for comparison with one embodiment of the present invention.
Figure 5C:
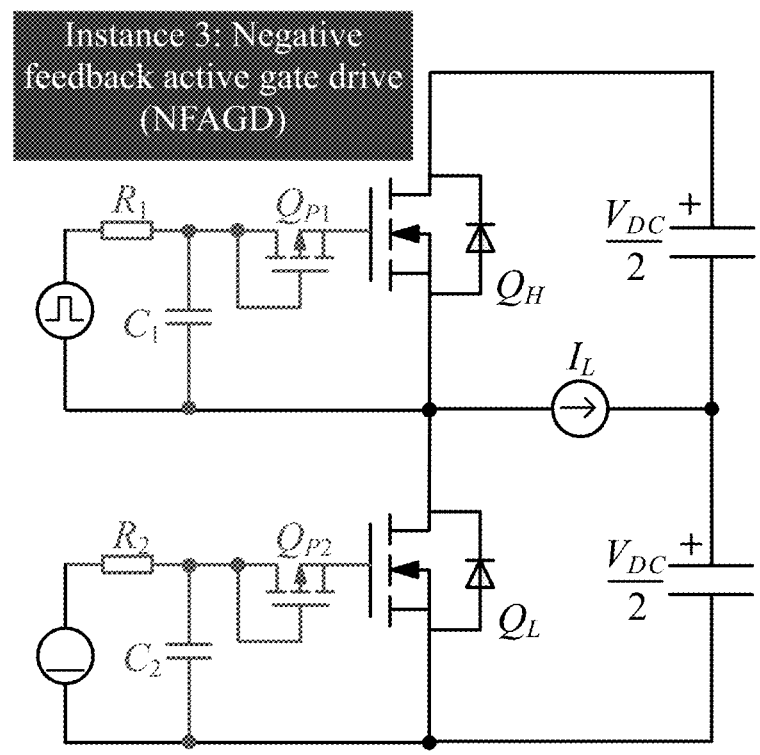
FIG. 5c is a diagram of an experimental circuit with one embodiment of the present invention.

FIG. 5a shows a diagram of an experimental circuit with the conventional gate drive without suppression for comparison with one embodiment of the present invention; FIG. 5b shows a diagram of an experimental circuit with the conventional gate drive that used passive suppression for comparison with one embodiment of the present invention; FIG. 5c shows a diagram of an experimental circuit with one embodiment of the present invention;

Each of these was provided with a drive pulse to drive the active MOSFET $Q_H$ and was provided with a negative voltage bias to turn off the passive MOSFET $Q_L$. In the embodiment, three instances were set up to compare how the gate-source voltage $v_{GS2}$ of the passive tube $Q_L$ could be interfered for demonstrating the effectiveness of the NFAGD in stabilizing the gate-source voltage.

Figure 6A:
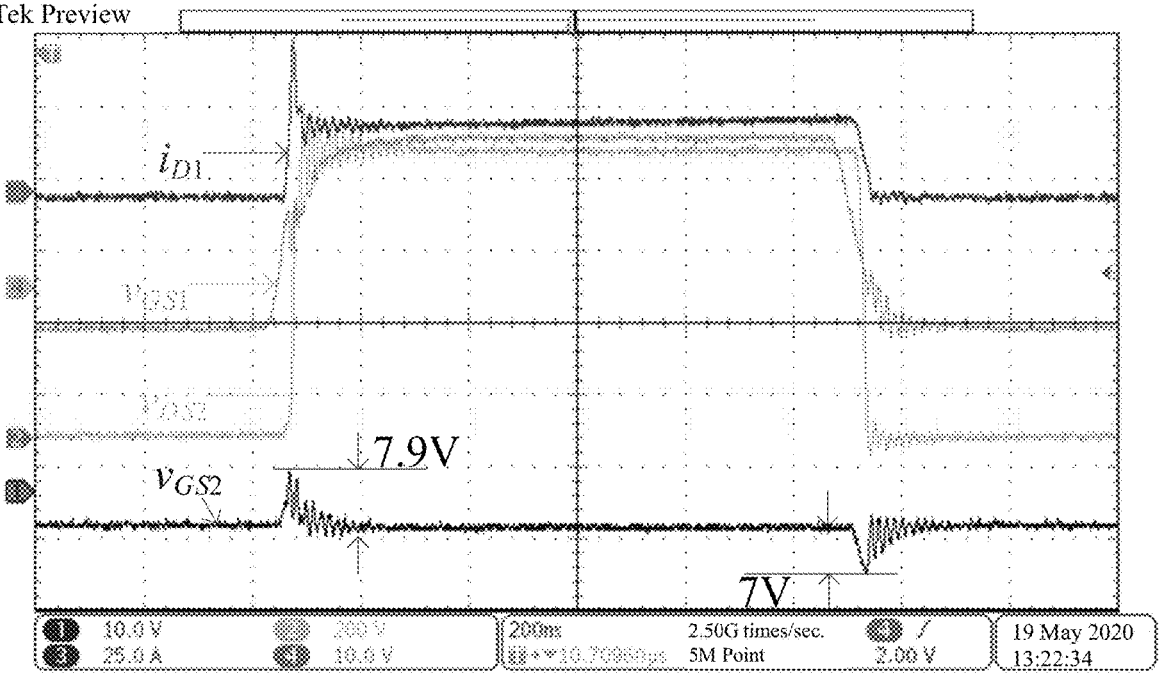
FIG. 6a is the experimental waveform of one switching cycle of an experimental circuit with the conventional gate drive without suppression.
Figure 6B:
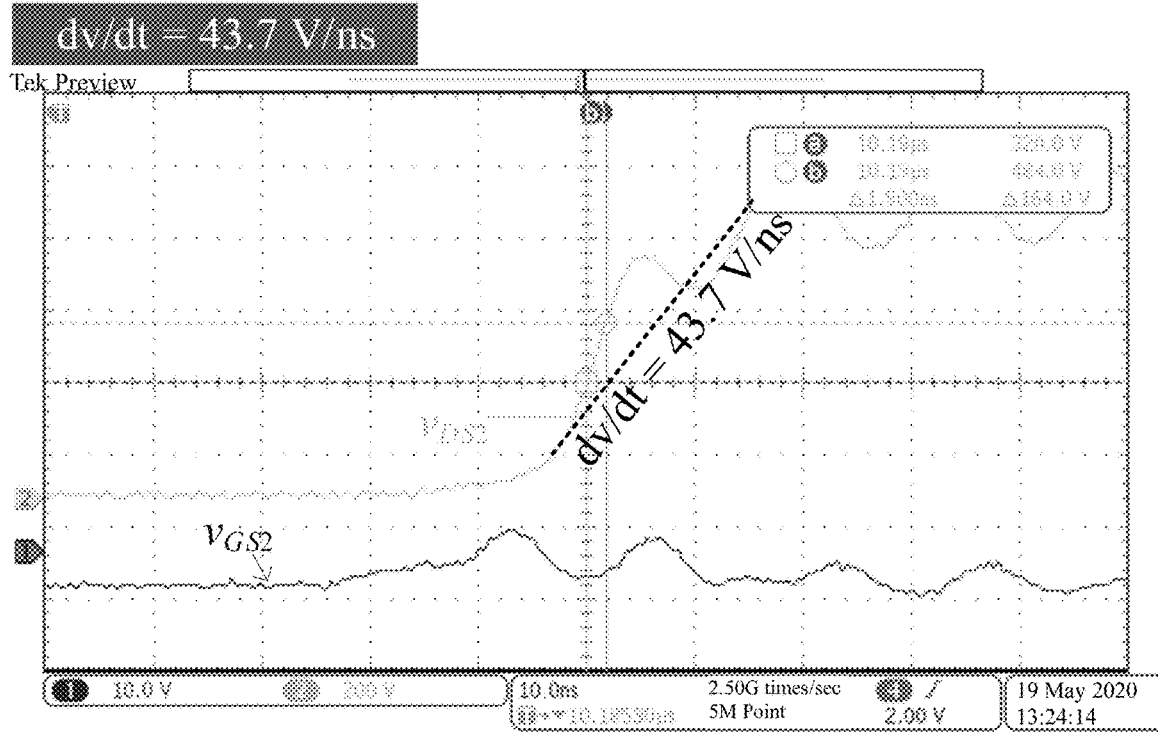
FIG. 6b is the enlarged rising edge of $v_{DS2}$ of an experimental circuit with the conventional gate drive without suppression.
Figure 6C:
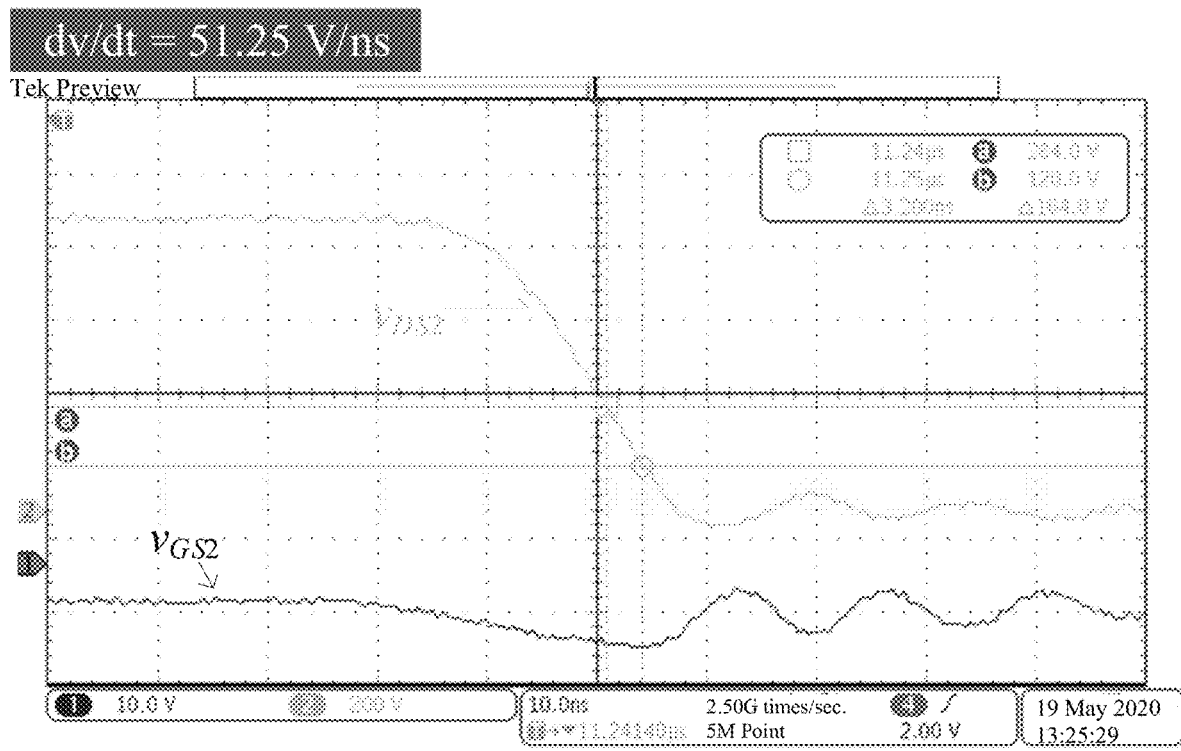
FIG. 6c is the enlarged falling edge of $v_{DS2}$ of an experimental circuit with the conventional gate drive without suppression.

FIG. 6a through FIG. 6c exhibit experimental waveforms of an experimental circuit with the conventional gate drive without suppression for comparison with one embodiment of the present invention. The drivers for the active tube $Q_H$ and the passive tube $Q_L$ were only each provided with a drive resistor. The corresponding drive resistors were both of 10Ω. As shown in FIG. 6a, the gate-source voltage $v_{GS2}$ of the passive tube $Q_L$ was interfered and showed obvious oscillation, with a forward interference magnitude up to 7.9V, and a negative interference magnitude up to 7V As shown in FIG. 6b, in the process where the drain-source voltage $v_{DS2}$ of the passive tube $Q_L$ rose, the rising slope of 100V-800V was about 43.7V/ns. As shown in FIG. 6c, in the process where the drain-source voltage $v_{DS2}$ of the passive tube $Q_L$ fell, the descending slope of 800V-100V was about 51.25V/ns. It is clear that the drain-source voltage $v_{DS2}$ of the passive tube $Q_L$ rose and fell faster, making the gate-source voltage $v_{GS2}$ of $Q_L$ obviously instable.

Figure 7A:
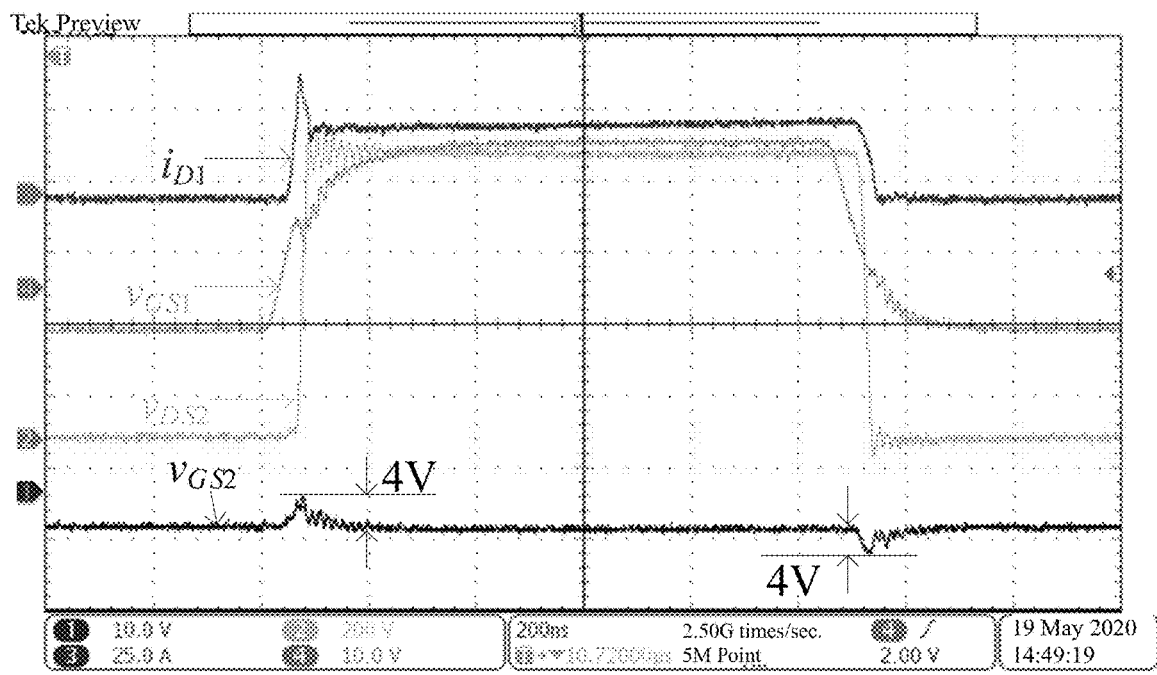
FIG. 7a is the experimental waveform of one switching cycle of an experimental circuit with the conventional gate drive that used passive suppression.
Figure 7B:
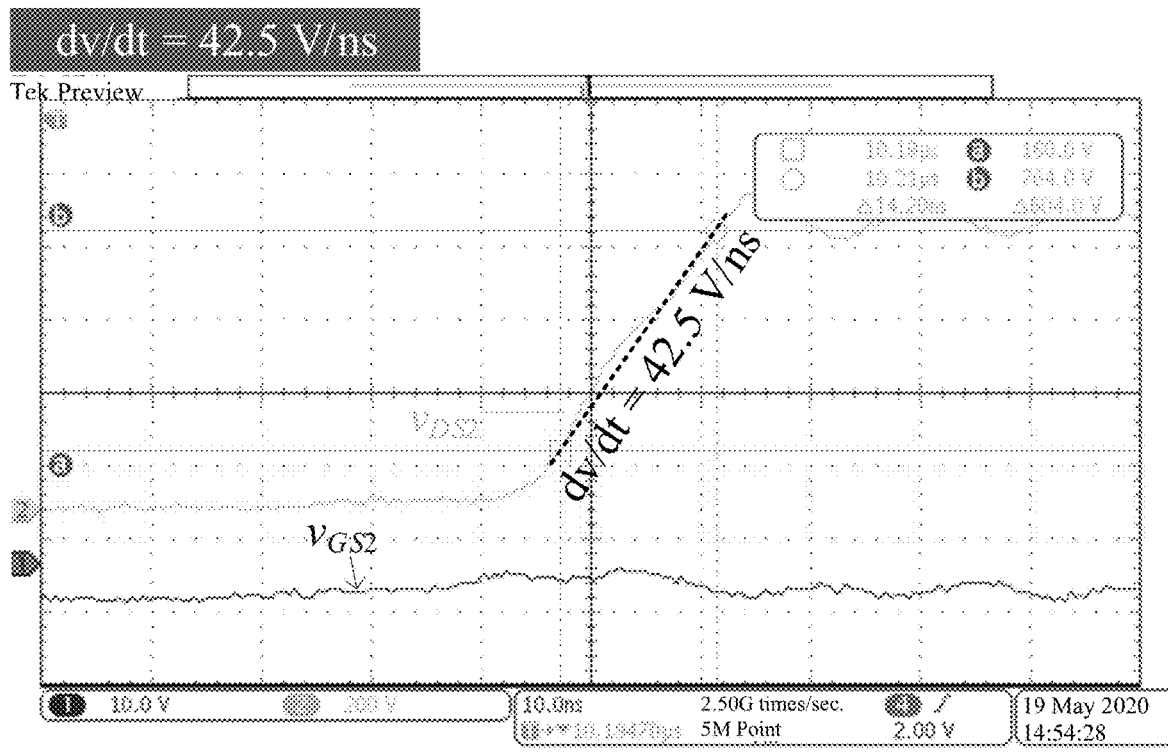
FIG. 7b is the enlarged rising edge of $v_{DS2}$ of an experimental circuit with the conventional gate drive that used passive suppression.
Figure 7C:
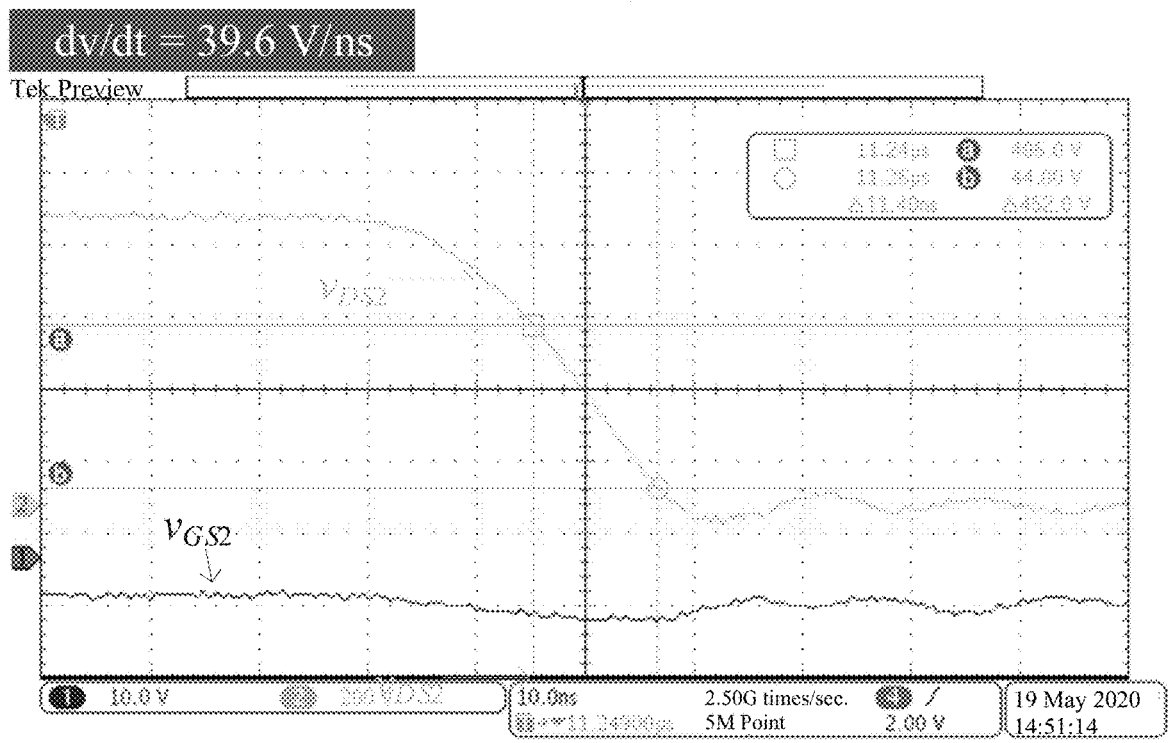
FIG. 7c is the enlarged falling edge of $v_{DS2}$ of an experimental circuit with the conventional gate drive that used passive suppression.

FIG. 7a through 7c show experimental waveforms of an experimental circuit with the conventional gate drive that used passive suppression for comparison with one embodiment of the present invention. The driving circuit for the active tube $Q_H$ and for the passive tube $Q_L$ was realized using gate-source shunt auxiliary capacitors. The drive resistors $R_1$, $R_2$ were 10Ω, and the gate-source shunt auxiliary capacitors $C_{a1}$, $C_{a2}$ were 2 nF. As shown in FIG. 7a, the interference-induced oscillation at the gate-source voltage $v_{GS2}$ of the passive tube $Q_L$ had a certain mitigate, with the forward interference magnitude being about 4V, and the negative interference magnitude being about 4V, too. As shown in FIG. 7b, in the process where the drain-source voltage $v_{DS2}$ of the passive tube $Q_L$ rose, the rising slope of 100V-800V was about 42.5V/ns. As shown in FIG. 7c, in the process where the drain-source voltage $v_{DS2}$ of the passive tube $Q_L$ fell, the descending slope of 800V-100V was about 9.6V/ns. Compared to the switching speed of the embodiment as shown in FIG. 6a through FIG. 6c significant decrease can be observed. It is thus clear that while passive gate oscillation suppression using gate-source shunt auxiliary capacitors effectively suppressed gate-source oscillation, the switching speed was sacrificed as a cost.

Figure 8A:
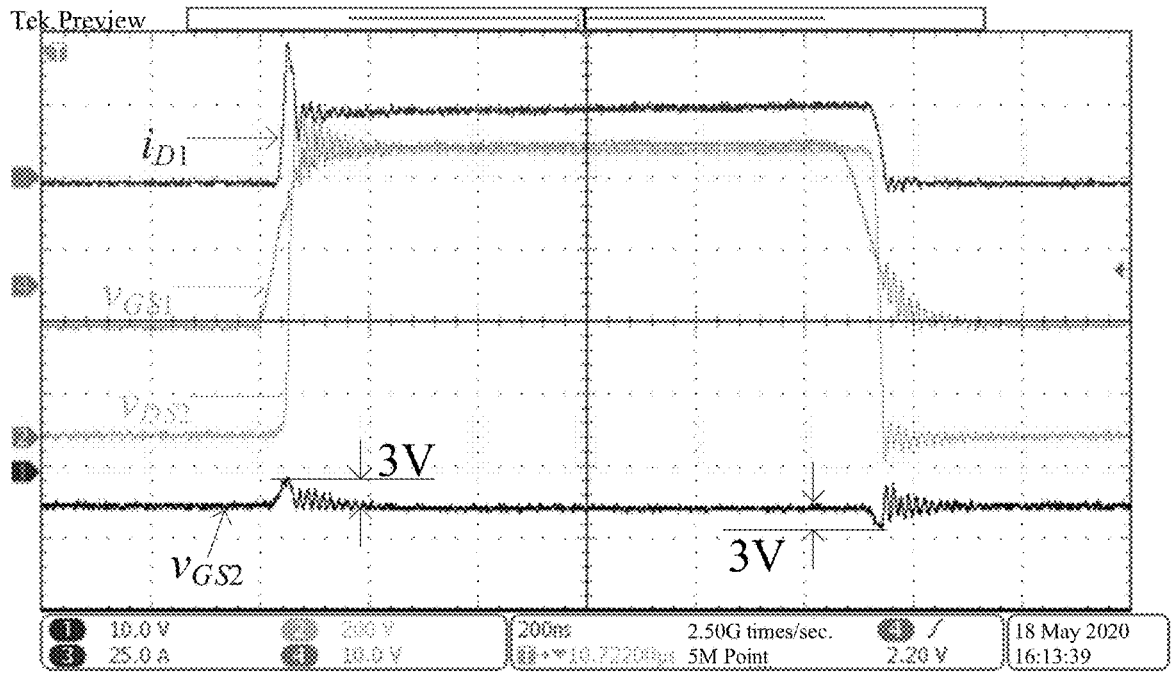
FIG. 8a is the experimental waveform of one switching cycle of an experimental circuit with one embodiment of the present invention.
Figure 8B:
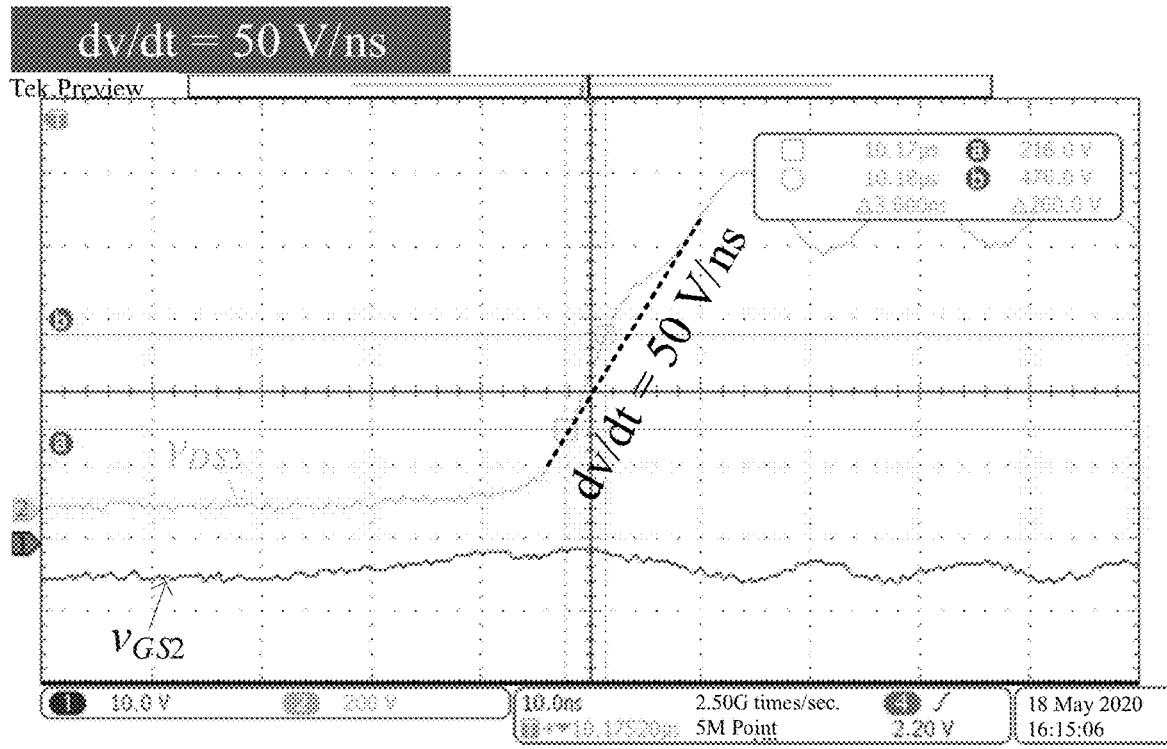
FIG. 8b is the enlarged rising edge of $v_{DS2}$ of an experimental circuit with one embodiment of the present invention.
Figure 8C:
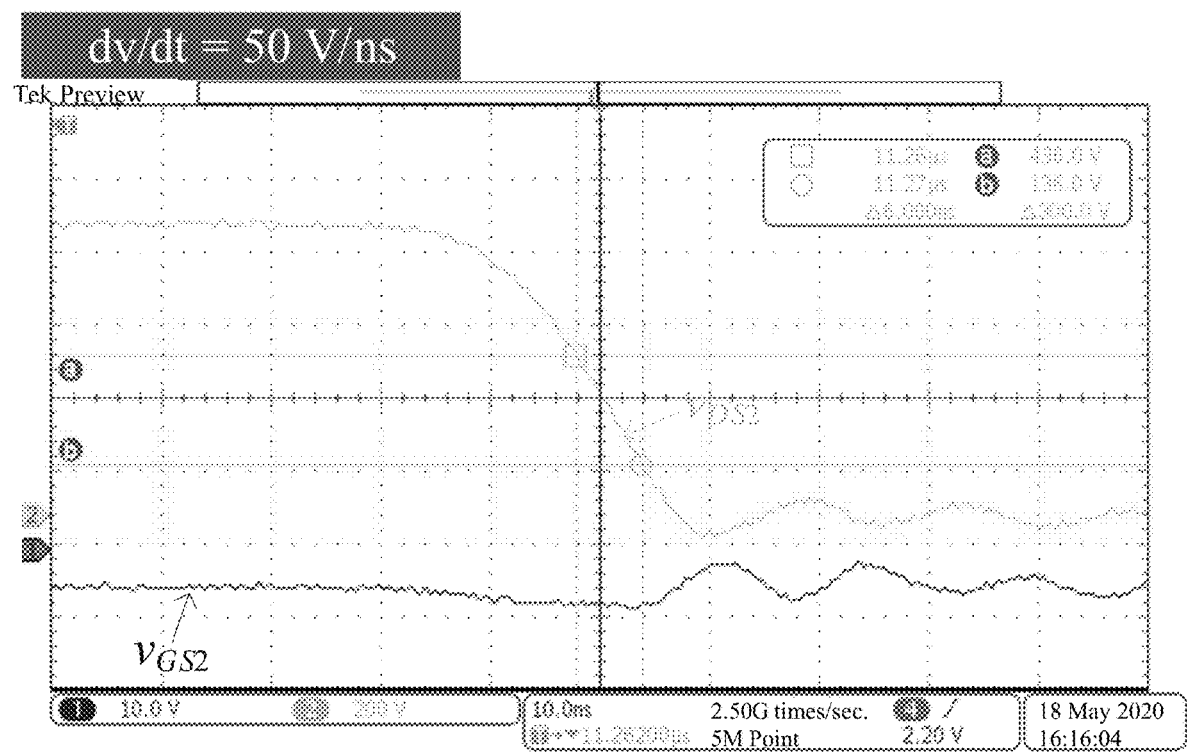
FIG. 8c is the enlarged falling edge of $v_{DS2}$ of an experimental circuit with one embodiment of the present invention.

FIG. 8a through FIG. 8c show experimental waveforms of one embodiment of the present invention using the NFAGD. The driving circuits for the active tube $Q_H$ and for the passive tube $Q_L$ were both realized using NFAGD. As shown in FIG. 8a, interference-induced oscillation at the gate-source voltage $v_{GS2}$ of the passive tube $Q_L$ was mitigated more significantly, with the forward interference magnitude being about 3V and the negative interference magnitude being about 3V, too. As shown in FIG. 8b, in the process where the drain-source voltage $v_{DS2}$ of the passive tube $Q_L$ rose, the rising slope of 100V-800V was about 50V/ns. As shown in FIG. 8c, in the process where the drain-source voltage $v_{DS2}$ of the passive tube $Q_L$ fell, the descending slope of 800V-100V was about 50V/ns. Compared to the passive suppression approach of the embodiment shown in FIG. 7a through FIG. 7c, the gate negative feedback active suppression circuit of the present invention provided more significant suppression of oscillation for the gate-source voltage, without sacrificing the switching speed. With the auxiliary capacitor (20 nF), compared to the switching speed of the embodiment as shown in FIG. 6a through FIG. 6c, the present invention improved the switching speed definitely.

An alternative mode for implementing the present invention will be given below.

As shown in FIG. 1, a negative feedback active gate drive (NFAGD), for connecting a drive signal to turn on and off a power MOSFET, i.e. the controlled MOSFET, comprises a push-pull drive circuit, a drive resistor, an auxiliary capacitor, and an auxiliary MOSFET.

The push-pull drive circuit, for generating a drive voltage $v_{GS}$* that controls a wide bandgap semiconductor device such as a SiC MOSFET or a Gallium Nitride Transistor. In particular, it provides a driving current to drive the controlled MOSFET. The drive signal is connected to the push-pull drive circuit (usually composed by the conventional gate drive chip and its power supplies), and the push-pull drive circuit and the third node are connected in series.

The drive resistor R has its one end connected in series with the push-pull drive circuit and an opposite end connected to the first node, for limiting a charging/discharging current applied to an auxiliary capacitor C by the push-pull drive circuit, thereby providing current limits and protection. A voltage difference between the first node and a source of the controlled MOSFET is the drive voltage.

The auxiliary capacitor C has one end connected to the first node, and an opposite end connected to the source S of the controlled MOSFET through the third node, so as to work with the drive resistor R to form the passive network for regulating a switching speed of the controlled MOSFET.

The auxiliary MOSFET is a P-channel MOSFET. Its source connected to the gate of the controlled MOSFET for creating a negative-feedback regulating mechanism, and its drain is connected to a drive voltage. The drive voltage is a voltage of a push-pull drive circuit that has been filtered by a passive network. The drain $D_p$ and the gate $G_p$ of the P-channel MOSFET are connected in series with the drive resistor R through the second node. The source $S_p$ of the P-channel MOSFET is connected to the gate G of the controlled MOSFET, for creating a negative-feedback regulating mechanism, thereby realizing self-stability of the gate voltage.

The push-pull drive circuit usually comprises a conventional gate drive chip and its power supplies, denoted as an on-bias voltage $V_{CC}$, and an off-bias voltage $V_{EE}$. The conventional gate drive chip has an output power positive terminal connected to the positive pole of the on-bias voltage $V_{CC}$. The conventional gate drive chip has an output power negative terminal connected to the negative pole of the off-bias voltage $V_{EE}$. The conventional gate drive chip has a drive output terminal connected to one end of the drive resistor R and has a drive input terminal connected to the drive signal. The negative pole of the on-bias voltage $V_{CC}$ and the positive pole of the off-bias voltage $V_{EE}$ are both connected to the third node. The push-pull drive circuit can be simply realized using a conventional gate drive chip or a totem pole circuit for MOSFETs. The $V_{CC}$ is the on-bias voltage, and the recommended on-bias voltage value is 18~22V. The $V_{EE}$ is the off-bias voltage, and the recommended off-bias voltage value is −2.5~−5V The recommended common-mode transient immunity (CMTI) for the drive chip is ≥100V/ns (over the full temperature range). In terms of driving capability, the chip output current should not be smaller than $(V_{CC}-V_{EE})/R_g$, where $R_g$ is the gate internal gate resistance of the controlled MOSFET.

Since the P-channel MOSFET has to bear certain levels of voltages and currents when the controlled MOSFET is switching, for ensuring its working safety, the levels of the voltages and currents of the auxiliary MOSFET have to be determined according to the on-bias voltage $V_{CC}$ and the off-bias voltage $V_{EE}$ of the designed push-pull drive circuit, and the gate properties of the controlled MOSFET. The recommended drain-source breakdown voltage is not smaller than $V_{CC}-V_{EE}$, and the recommended maximum permissible continuous drain current is not smaller than $(V_{CC}-V_{EE})/R_g$. Meanwhile, for ensuring the control precision, the transconductance gain of the P-channel auxiliary MOSFET should be much greater than 1(S).

Functionally, the auxiliary capacitor C not only regulates the switching speed of the controlled MOSFET, but also helps to minimize the area of the loop formed by the push-pull drive circuit, the auxiliary MOSFET, and the gate and source of the controlled MOSFET, realizing high-frequency decoupling of the drive loop.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A power MOSFET gate drive based on negative feedback mechanism, for connecting a drive signal to turn on and off a controlled MOSFET, comprising:

an auxiliary MOSFET, being a P-channel MOSFET, and having its source connected to a gate of the controlled MOSFET for creating a negative-feedback regulating mechanism, the auxiliary MOSFET having its drain connected to a drive voltage; the drive voltage being a voltage of a drive chip that has been filtered by a passive network;

a first node, a second node, and a third node;

a push-pull drive circuit, for providing a driving current to drive the controlled MOSFET, the drive signal being connected to the push-pull drive circuit, and the push-pull drive circuit and the third node being connected in series; and a drive resistor R, having one end connected in series with the push-pull drive circuit, and having an opposite end connected to the first node, for limiting a charging/discharging current applied to an auxiliary capacitor C by the push-pull drive circuit, and a voltage difference between the first node and a source of the controlled MOSFET being the drive voltage;

the auxiliary capacitor C having one end connected to the first node and having an opposite end connected to the source of the controlled MOSFET through the third node, so as to work with the drive resistor R to form the passive network for regulating a switching speed of the controlled MOSFET;

wherein the drain and the gate of the auxiliary MOSFET connect in series with the drive resistor R through the second node, and the source of the auxiliary MOSFET is connected to the gate of the controlled MOSFET for creating the negative-feedback regulating mechanism.

2. The power MOSFET gate drive based on negative feedback mechanism of claim 1, wherein the push-pull drive circuit comprises a MOSFET gate drive chip, an on-bias voltage $V_{CC}$ and an off-bias voltage $V_{EE}$; the MOSFET gate drive chip having a positive supply terminal connected to a positive pole of the on-bias voltage $V_{CC}$, the MOSFET gate drive chip having a negative supply terminal connected to a negative pole of the off-bias voltage $V_{EE}$, the MOSFET gate drive chip having a drive output terminal connected to one end of the drive resistor R and having a drive input terminal connected to the drive signal; and a negative pole of the on-bias voltage $V_{CC}$ and a positive pole of the off-bias voltage $V_{EE}$ both being connected to the third node, whereby in terms of driving capability, a permissible output current of the MOSFET drive chip should not be smaller than $(V_{CC}-V_{EE})/R_g$.

3. The power MOSFET gate drive based on negative feedback mechanism of claim 1, wherein the auxiliary MOSFET has a drain-source breakdown voltage not smaller than $V_{CC}-V_{EE}$, and has a maximum permissible continuous drain current not smaller than $(V_{CC}-V_{EE})/R_g$.

* * * * *